US012449111B2

(12) United States Patent
Kondo et al.

(10) Patent No.: US 12,449,111 B2
(45) Date of Patent: Oct. 21, 2025

(54) LED ILLUMINATION APPARATUS WITH PLURALITY OF LENS HOUSINGS

(71) Applicant: HotaluX, Ltd., Tokyo (JP)

(72) Inventors: Toshiyuki Kondo, Tokyo (JP); Takashi Mogi, Tokyo (JP)

(73) Assignee: HOTALUX, LTD., Tokyo (JP)

( * ) Notice: Subject to any disclaimer, the term of this patent is extended or adjusted under 35 U.S.C. 154(b) by 0 days.

(21) Appl. No.: 18/702,998

(22) PCT Filed: Oct. 5, 2022

(86) PCT No.: PCT/JP2022/037328
§ 371 (c)(1),
(2) Date: Apr. 19, 2024

(87) PCT Pub. No.: WO2023/068058
PCT Pub. Date: Apr. 27, 2023

(65) Prior Publication Data
US 2024/0418351 A1 Dec. 19, 2024

(30) Foreign Application Priority Data

Oct. 22, 2021 (JP) ................. 2021-172808

(51) Int. Cl.
*F21V 17/06* (2006.01)
*F21V 5/04* (2006.01)
(Continued)

(52) U.S. Cl.
CPC ............... *F21V 17/06* (2013.01); *F21V 5/04* (2013.01); *F21V 17/005* (2013.01);
(Continued)

(58) Field of Classification Search
CPC ...... F21V 17/06; F21V 17/005; F21V 17/104; F21Y 2103/10; F21Y 2105/10
See application file for complete search history.

(56) References Cited

U.S. PATENT DOCUMENTS 3,473,015 A * 10/1969 Haas ................. H01R 33/09
439/558
4,471,415 A * 9/1984 Larson ................ F21V 21/34
362/396

(Continued)

FOREIGN PATENT DOCUMENTS

| CN | 210266783 U | 4/2020 |
|---|---|---|
| JP | 2017-016955 A | 1/2017 |
| KR | 10-2013-0131270 A | 12/2013 |

OTHER PUBLICATIONS

International Search Report for PCT/JP2022/037328 dated Nov. 22, 2022.

*Primary Examiner* — Ismael Negron
(74) *Attorney, Agent, or Firm* — Sughrue Mion, PLLC

(57) ABSTRACT

An LED illumination apparatus includes a plurality of the LEDs mounted on an LED substrate, a plurality of housings disposed on the LED substrate and each having a projection to be fitted with a corresponding one of a plurality of positioning holes formed in the substrate, a plurality of lenses fixed to the housings, and a cover disposed over the lenses and the housings. Each one of the housings includes connection parts configured to be positioned through fitting between the positioning holes and the projections of an adjacent housing to connect them between the positioning holes and the projections of an adjacent housing connect them together; interconnected housings held in position by the cover.

15 Claims, 12 Drawing Sheets

(51) Int. Cl.
*F21V 17/00* (2006.01)
*F21V 17/16* (2006.01)
*F21Y 103/10* (2016.01)
*F21Y 113/00* (2016.01)
*F21Y 115/10* (2016.01)

(52) U.S. Cl.
CPC ......... *F21V 17/164* (2013.01); *F21Y 2103/10* (2016.08); *F21Y 2113/00* (2013.01); *F21Y 2115/10* (2016.08)

(56) References Cited

U.S. PATENT DOCUMENTS

| | | | | |
|---|---|---|---|---|
| 4,555,749 A * | 11/1985 | Rifkin | ................ | F21V 19/002 362/382 |
| 4,935,856 A * | 6/1990 | Dragoon | ................ | A23B 2/40 362/800 |
| 4,959,761 A * | 9/1990 | Critelli | ................ | F21V 19/002 362/800 |
| 4,999,755 A * | 3/1991 | Lin | ................ | F21V 21/35 439/211 |
| 5,113,329 A * | 5/1992 | Lin | ................ | F21S 2/00 362/800 |
| RE34,254 E * | 5/1993 | Dragoon | ................ | F21V 19/005 362/800 |
| 5,918,966 A * | 7/1999 | Arnold | ................ | H01K 1/26 362/255 |
| 6,048,082 A * | 4/2000 | Washimoto | ................ | F21V 19/0025 362/255 |
| 6,086,225 A * | 7/2000 | Kahl | ................ | F21V 19/0025 362/293 |
| 7,226,185 B2 * | 6/2007 | Dolgin | ................ | G02B 3/00 362/455 |
| 7,631,985 B1 * | 12/2009 | Knoble | ................ | F21V 19/0015 362/240 |
| 7,878,683 B2 * | 2/2011 | Logan | ................ | F21V 15/04 362/249.02 |
| 8,061,868 B2 * | 11/2011 | Dubord | ................ | F21V 19/02 362/232 |
| 8,226,276 B2 * | 7/2012 | Pachler | ................ | G08G 5/21 362/455 |
| 8,287,150 B2 * | 10/2012 | Schaefer | ................ | F21V 7/0091 362/249.02 |
| 8,456,768 B2 * | 6/2013 | Shih | ................ | F21V 17/005 359/830 |
| 9,347,658 B2 * | 5/2016 | Kwak | ................ | F21V 17/104 |
| 9,562,675 B2 * | 2/2017 | Ahmed | ................ | F21V 19/002 |
| 11,041,609 B2 * | 6/2021 | Aviram | ................ | F21V 17/10 |
| 2007/0064428 A1 * | 3/2007 | Beauchamp | ................ | F21S 4/28 362/294 |
| 2010/0118550 A1 * | 5/2010 | Kuo | ................ | H01L 33/58 359/818 |
| 2011/0136374 A1 * | 6/2011 | Mostoller | ................ | F21V 19/04 439/487 |
| 2012/0051056 A1 * | 3/2012 | Derks | ................ | F21V 19/001 362/257 |
| 2017/0003002 A1 * | 1/2017 | Lee | ................ | F21V 17/005 |

* cited by examiner

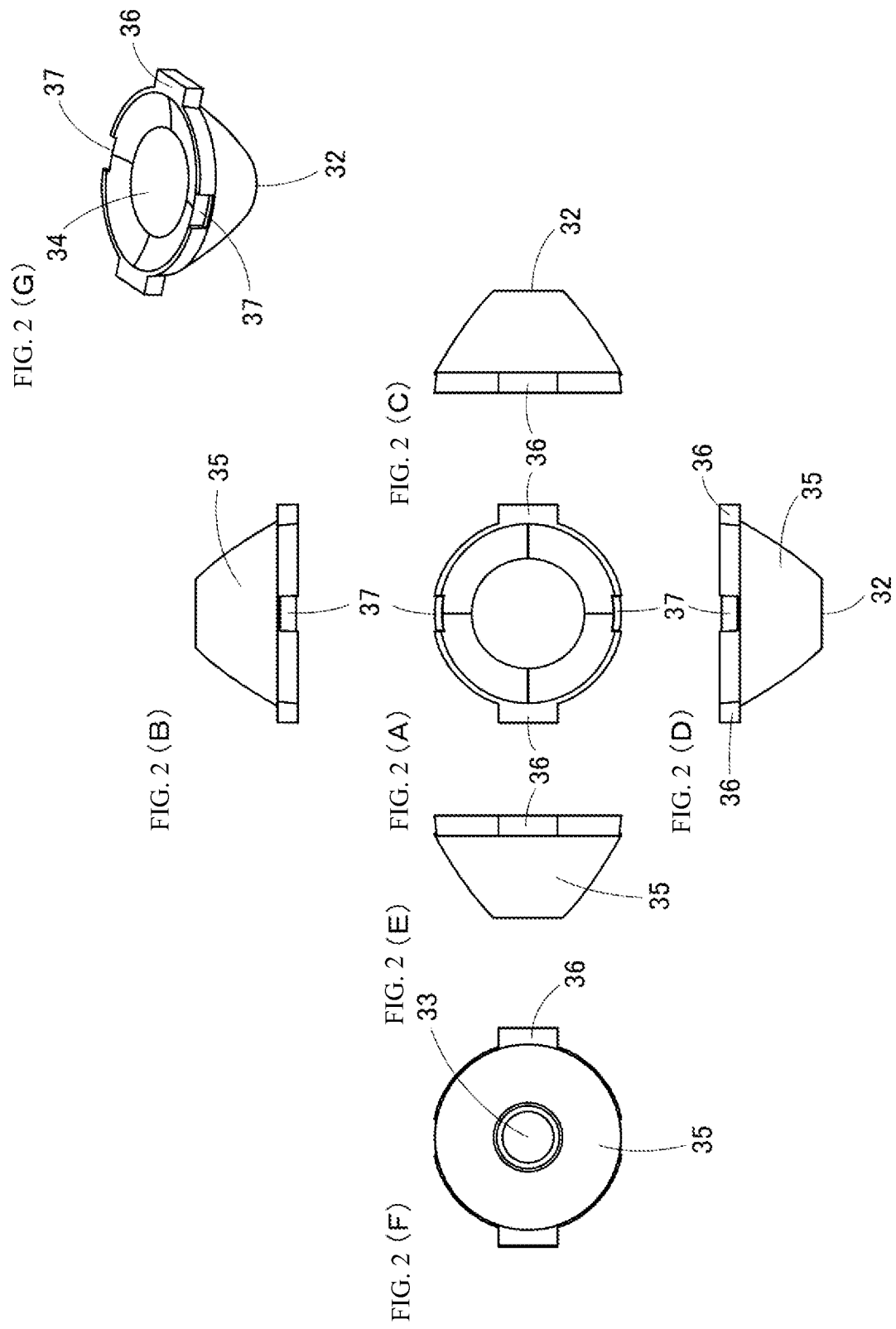

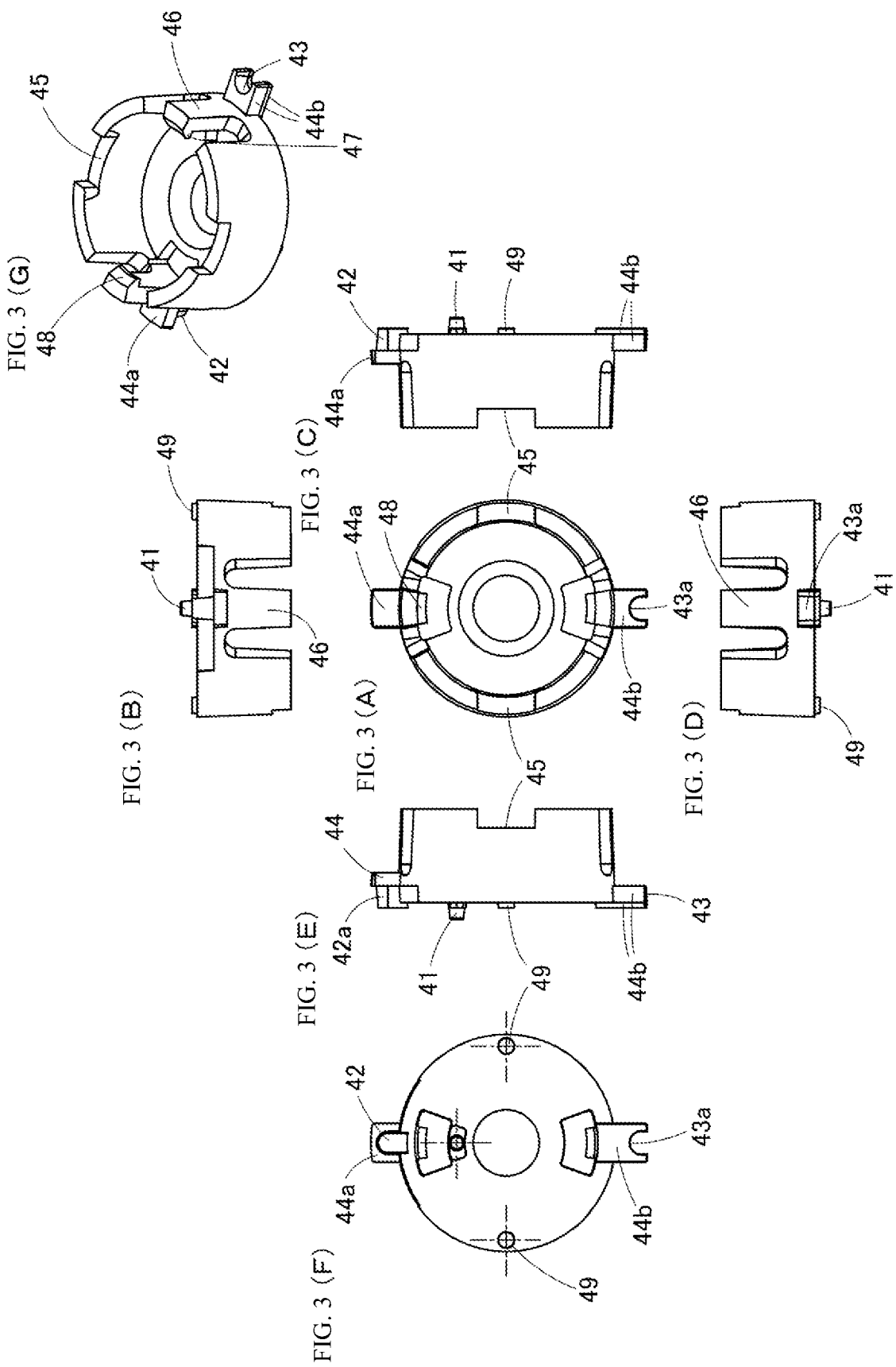

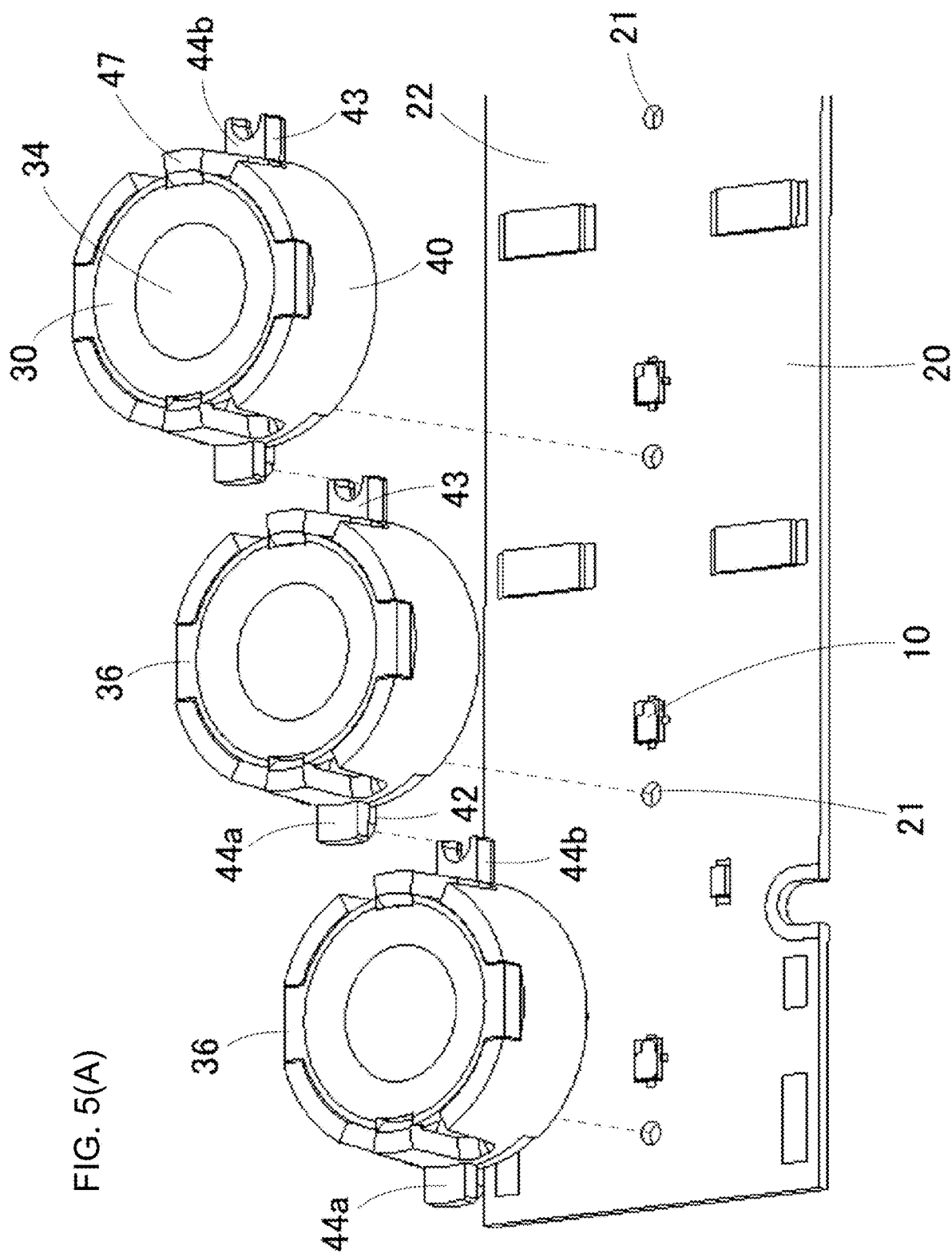

LED ILLUMINATION APPARATUS WITH PLURALITY OF LENS HOUSINGS

CROSS REFERENCE TO RELATED APPLICATIONS

This application is a National Stage of International Application No. PCT/JP2022/037328 filed Oct. 5, 2022, claiming priority based on Japanese Patent Application No. 2021-172808 filed Oct. 22, 2021.

TECHNICAL FIELD

The present invention relates to an optical lens mounting structure for LED illumination, a lens mounting method, an LED illumination apparatus, and an LED illumination apparatus manufacturing method.

BACKGROUND ART

When providing an LED illumination apparatus with an optical lens (hereinafter merely referred to as a "lens") for varying distribution of light from an LED mounted on a mounting substrate, it is necessary to position and mount the lens on an LED substrate or its peripheral member, for example by coaxially providing the center of the LED and the center of the lens.

However, if providing the lens with an additional structure such as a mounting boss part and a mounting hole for positioning and fixing the lens to the LED substrate or its peripheral member, sink marks, air bubbles, and other defects may apt to occur in a molded article at the timing of molding of the lens. In addition, the additional structures and the defects in the molded article may affect optical characteristics of the lens body.

Further, for positioning and mounting the lens on the LED substrate, the LED substrate needs two or more positioning holes for one lens (see Patent Literature 1). Thus, routing of a wiring pattern in the LED substrate needs much elaboration and trial-and-error.

CITATION LIST

Patent Literature

Patent Literature 1: JP 2017-16955A

SUMMARY

Technical Problem

Certain exemplary embodiments can provide a lens mounting structure for an LED illumination apparatus which allows mounting lenses correspondingly to LEDs mounted on an LED substrate without increasing center alignment errors while reducing the number of positioning holes for one lens (or one housing as a member for mounting the lens) in the LED substrate, a lens mounting method using the lens mounting structure, an LED illumination apparatus including the lens mounting structure, and an LED illumination apparatus manufacturing method including the lens mounting method.

Solution to Problem

To achieve the above features, the some exemplary embodiments can provide a lens mounting structure 1 for an LED illumination apparatus, including:

an LED substrate with a plurality of LEDs mounted thereon and having positioning holes number of which is the same as number of a plurality of housings;

the plurality of housings disposed on an LED mounting face of the LED substrate correspondingly to the respective LEDs, and each having a projection to be fitted with the positioning hole;

lenses positioned and fixed to the housings, and a cover for covering peripheral parts of light emitting sides of the lenses and/or light emitting sides of the housings to hold the lenses and the housings, wherein the plurality of housings are connected to the adjoining housings by connection parts, each of the housings on the LED substrate is positioned through fitting between the positioning hole and the projection, and through connection by the connection parts, and the cover is for holding a state of the positioning.

In the lens mounting structure 1, the plurality of housings may be disposed in one or two or more linear or curved lines on the LED mounting face of the LED substrate.

Other embodiments also can provide a lens mounting structure 2 for an LED illumination apparatus, including:

an LED substrate with a plurality of LEDs mounted thereon in three or more lines and having positioning holes aligned in two or more lines;

housings disposed on an LED mounting face of the LED substrate in two or more lines correspondingly to the respective LEDs;

lenses positioned and fixed to the housings, and a cover for holding peripheral parts of light emitting sides of the lenses and/or light emitting sides of the housings, wherein among the housings disposed in two or more lines, each of the housings in both outermost lines or the housings in odd lines (hereinafter referred to "K-line housings") has one projection to be fitted with the positioning hole, and connected to the adjoining housing by connection parts, each of the housings excluding the K-line housings (hereinafter referred to as "L-line housings") is connected to the adjoining housing by the connection parts and articulated to the housing in the adjoining line via an articulation part, but does not have the projection formed thereon, the K-line housings on the LED substrate are each positioned by fitting between the poisoning hole and the projection, and connection by the connection parts, the L-line housings on the LED substrate are each positioned by connection by the connection parts and articulation via the articulation part, and the cover is for holding states of the positioning.

Still other exemplary embodiments also can provide a lens mounting method for an LED illumination apparatus, including:

(A) preparing
 (a) a plurality of lenses,
 (b) a plurality of housings for positioning and fixing the lenses, each having a projection for positioning at bottom face and having connection parts for connection to the adjoining housing,
 (c) an LED substrate with a plurality of LEDs mounted thereon and having positioning hole number of which is the same as number of the housings, and
 (d) a cover;
(B) positioning and fixing the lens to the housing;
(C) connecting the adjoining housings to each other by the connection parts;

(D) fitting the projection of the housing with the positioning hole, and (E) covering a peripheral part of light emitting sides of the lenses and/or light emitting sides of the housings with the cover to hold states of the positioning of the housings in the LED substrate effected by the operations (C) and (D).

Advantageous Effects

Some of the exemplary embodiments can reduce the number of positioning holes for one housing in an LED substrate without increasing center alignment errors between LEDs mounted on the LED substrate and lenses fixed to the housings. Therefore, routing of a wiring pattern in the LED substrate can be less affected by the positioning holes, thus facilitating design of the wiring pattern.

BRIEF DESCRIPTION OF DRAWINGS

FIGS. 2A to 2G are sketches of the lens in the exemplary embodiment. FIG. 2A is a plan view. FIGS. 2B to 2E show the lens of FIG. 2A viewed from each direction. FIG. 2F shows the lens viewed from below (light entering side). FIG. 2G is an overall view of the lens.

FIGS. 3A to 3G are sketches of the housing in the exemplary embodiment. FIG. 3A is a plan view. FIGS. 3B to 3E show the housing of FIG. 3A viewed from each direction. FIG. 3F shows the lens viewed from below (light entering side). FIG. 3G is an overall view of the housing.

FIG. 5A is a sketch of a plurality of housings with the lenses positioned and fixed thereto and the LED substrate having positioning holes in the exemplary embodiment in a state before disposition, viewed from the side of the LED mounting face, where the LEDs are mounted in one line, the housings are disposed in one line, and the positioning holes are aligned in one line, respectively.

DESCRIPTION OF EMBODIMENTS

Figure 1:
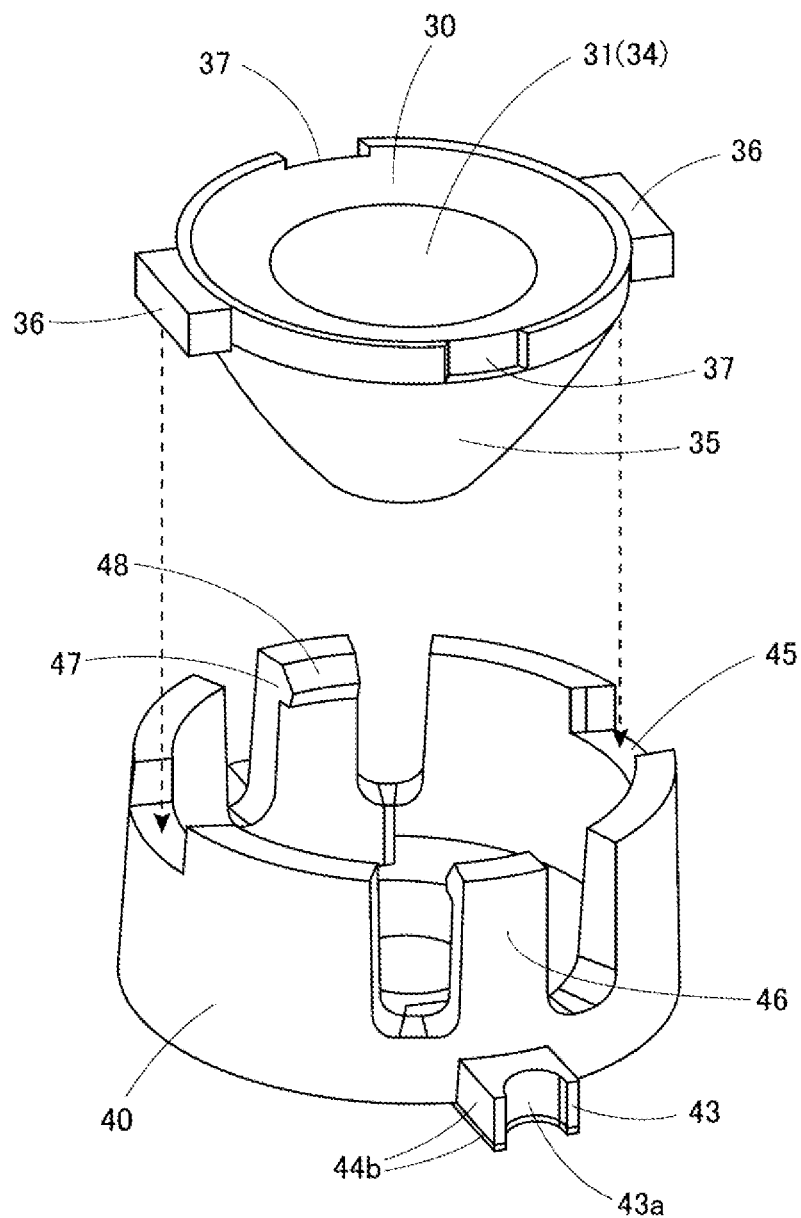
FIG. 1 is a sketch of the lens and the housing in an exemplary embodiment of a lens and lens mounting structure in a state before fixation.

A lens mounting structure for LED illumination, A lens mounting method, the LED illumination apparatus, and A LED illumination apparatus manufacturing method according to exemplary embodiments are described below in detail with reference to the drawings. However, the present invention is not limited to the following descriptions. In the following FIGS. 1 to 10, identical parts are indicated with identical reference signs with appropriately omitting the explanations. Furthermore, for convenience in explanation, the structure of each component shown in the drawings may be appropriately simplified, and the size, the ratio, and the like of components may be schematically shown and different from actual ones.

In the present specification, the terms "above, upper" and "below, lower" for describing positions and dispositions respectively mean the light emitting side and the light entering side of the lens, unless otherwise stated. The terms "vertical" and "lateral" respectively mean in an up-and-down direction along an optical axis of the lens, and in a vertical direction to the optical axis of the lens, unless otherwise stated. The description of disposing or forming of a plurality of members or elemental structures such as protrusions and recessed parts, implies that the disposing or forming is performed almost uniformly or more uniformly (10% or less, 5% or less, or 1% or less of errors) unless otherwise stated. When describing a numerical range, "to" means including the lower limit value and the upper limit value.

First Embodiment

FIG. 1 is a sketch of a lens 30 and a housing 40 in an exemplary embodiment of the present invention in a state before fixation. The lens 30 is configured to be positioned and fixed 15 to the housing 40, by being moved in the direction of the arrows (optical axis direction of the lens 30) from the position shown in the sketch.

FIGS. 2A to 2G are sketches of the lens 30 in the exemplary embodiment. FIG. 2A shows the lens 30 viewed from above (light emitting side). FIGS. 2B to 2E show the lens 30 of FIG. 2A viewed from each direction. FIG. 2F shows the lens 30 viewed from below (light 20 entering side). FIG. 2G is an overall view of the lens 30.

FIGS. 3A to 3G are sketches of the housing 40 in the exemplary embodiment. FIG. 3A shows the housing 40 viewed from above (light emitting side). FIGS. 3B to 3E show the housing 40 of FIG. 3A viewed from each direction. FIG. 3F shows the housing 40 viewed from below (light entering side). FIG. 3G is an overall view of the housing 40.

Figure 4A:
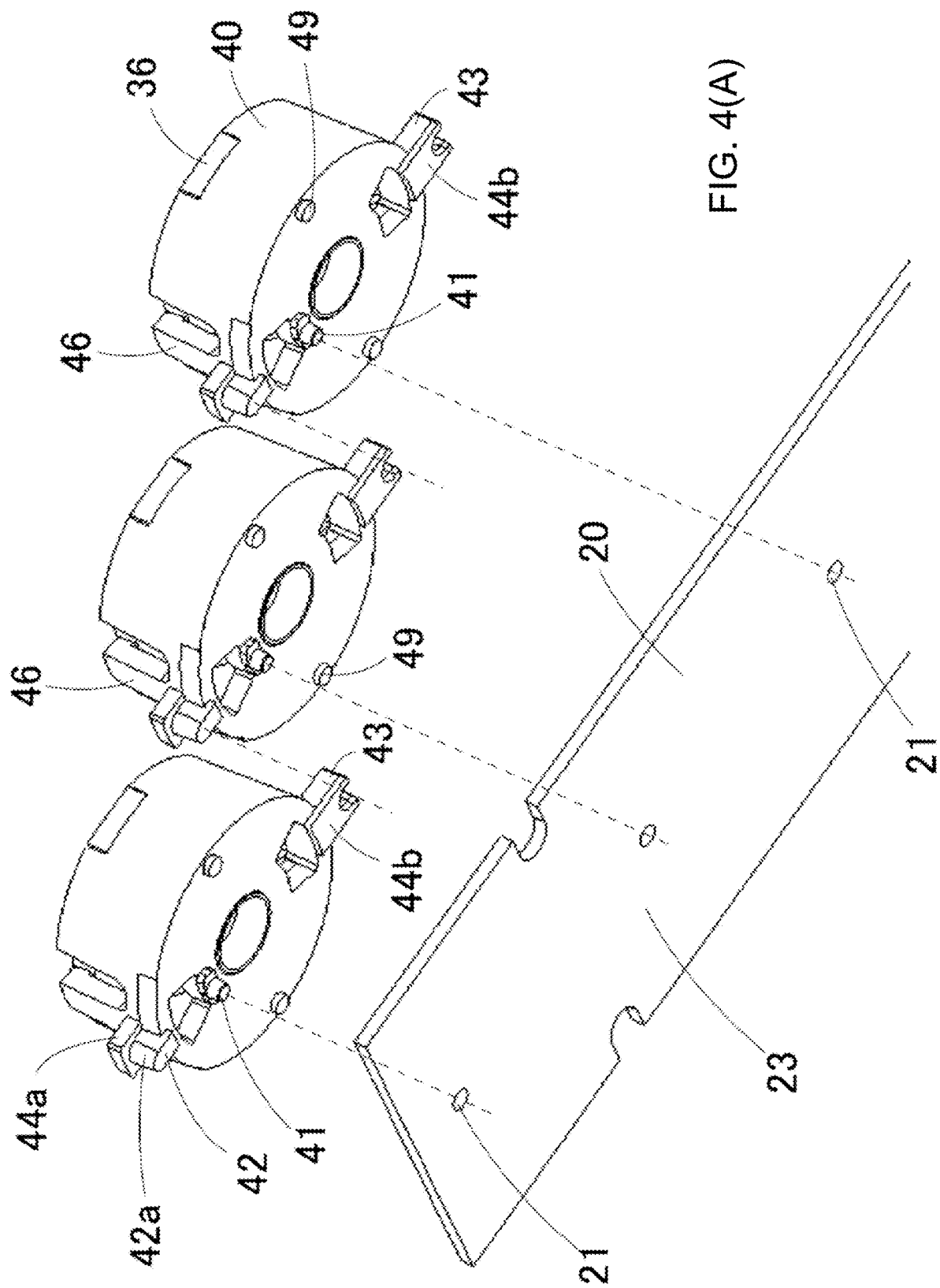
FIG. 4A is a sketch of a plurality of housings with the lenses positioned and fixed thereto and the LED substrate in the exemplary embodiment in a state before disposition, viewed from the back side of the LED mounting face where positioning holes aligned in one line.
Figure 4B:
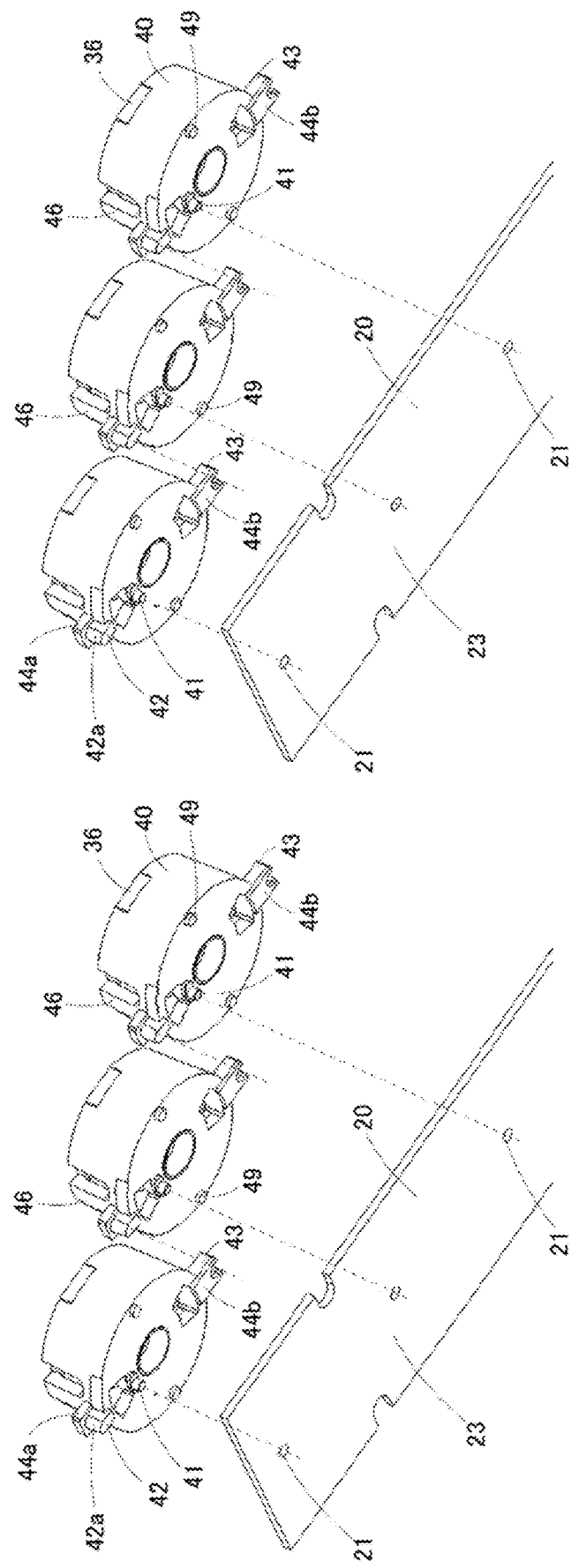
FIG. 4B is another sketch having two-structures (i.e. positioning holes aligned in two lines) of FIG. 4A parallel to each other.
Figure 4C:
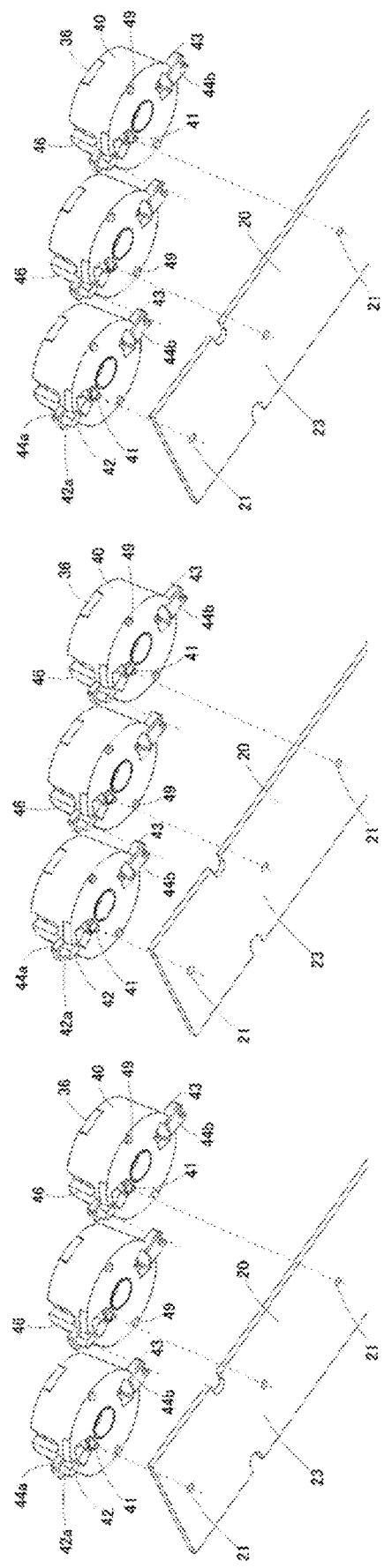
FIG. 4C is the other sketch having tree-structures (i.e. positioning holes aligned in tree lines) of FIG. 4A parallel to one another.
Figure 5B:
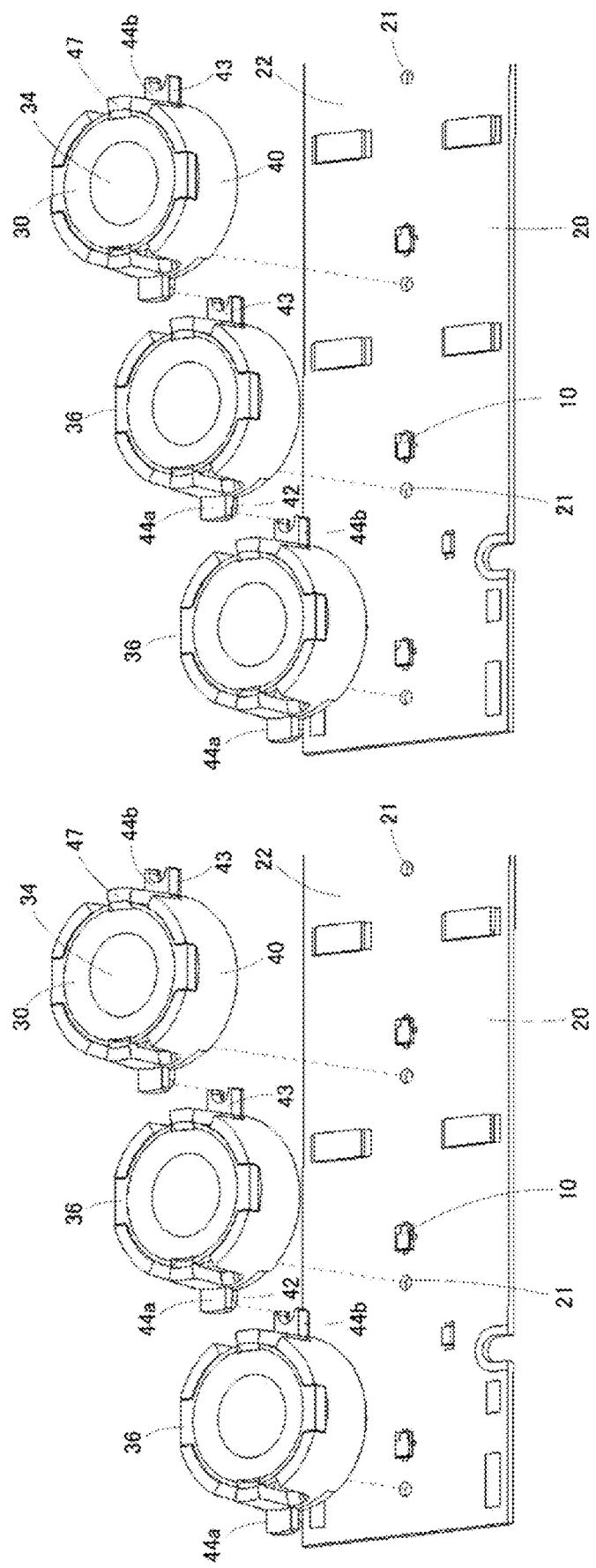
FIG. 5B is the same as FIG. 5A except for having two lines of the LEDs, the housings, and the positioning holes respectively.
Figure 5C:
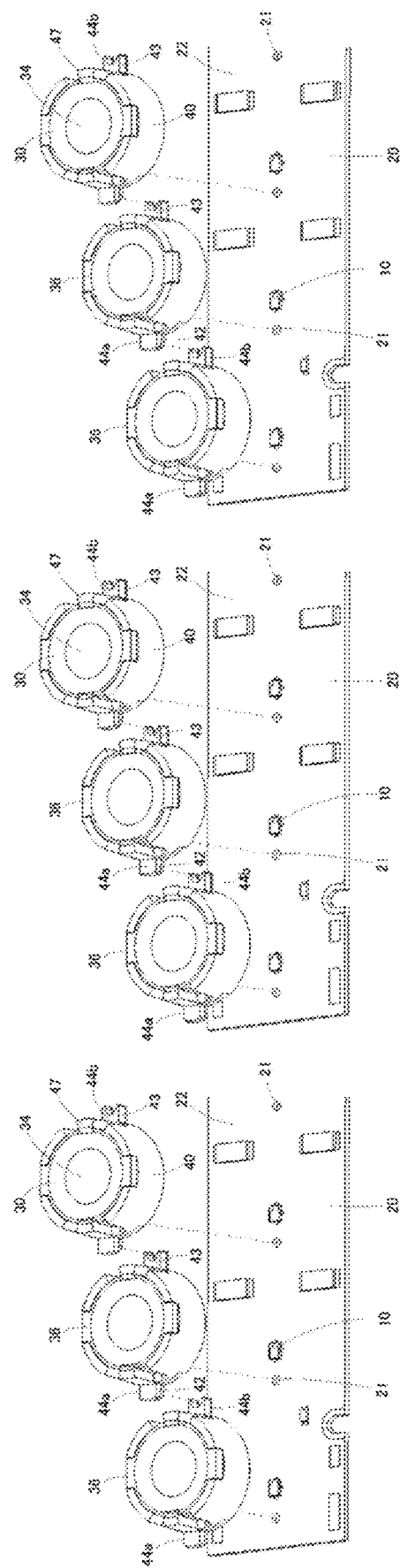
FIG. 5C is the same as FIG. 5A except for having tree lines of the LEDs, the housings, and the positioning holes respectively.

FIGS. 4(A), 4(B) and 4(C) are sketches of a plurality of housings 40 with the lenses 30 positioned and fixed thereto and an LED substrate 20 in the exemplary embodiment in a state before disposition, viewed from the back side of an LED mounting face 23. FIGS. 5(A), 5(B) and 5(C) are sketches of a plurality of housings 40 with the lenses 30 positioned and fixed thereto and the LED substrate 20 in the exemplary embodiment in a state before disposition, viewed from the side of an LED mounting face 22.

Figure 6:
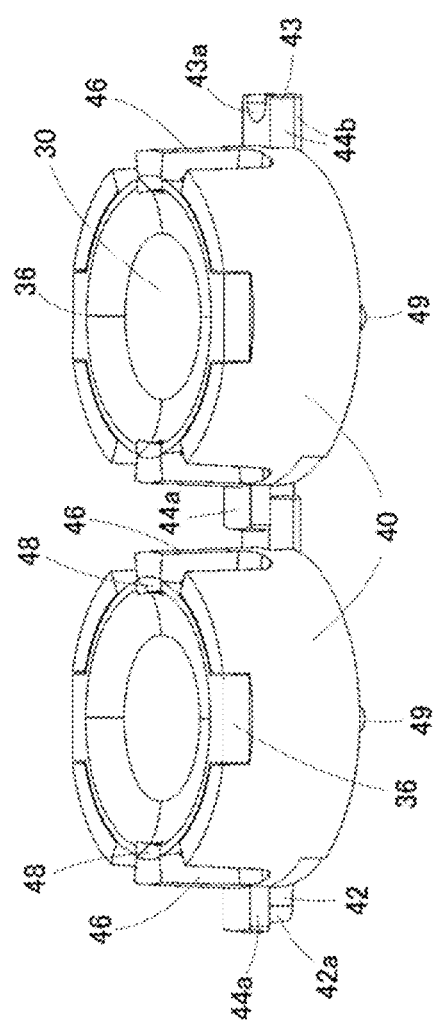
FIG. 6 is a sketch of two housings connected to each other with the lenses positioned and fixed thereto in the exemplary embodiment, viewed from the light emitting side with the LED substrate omitted.
Figure 7:
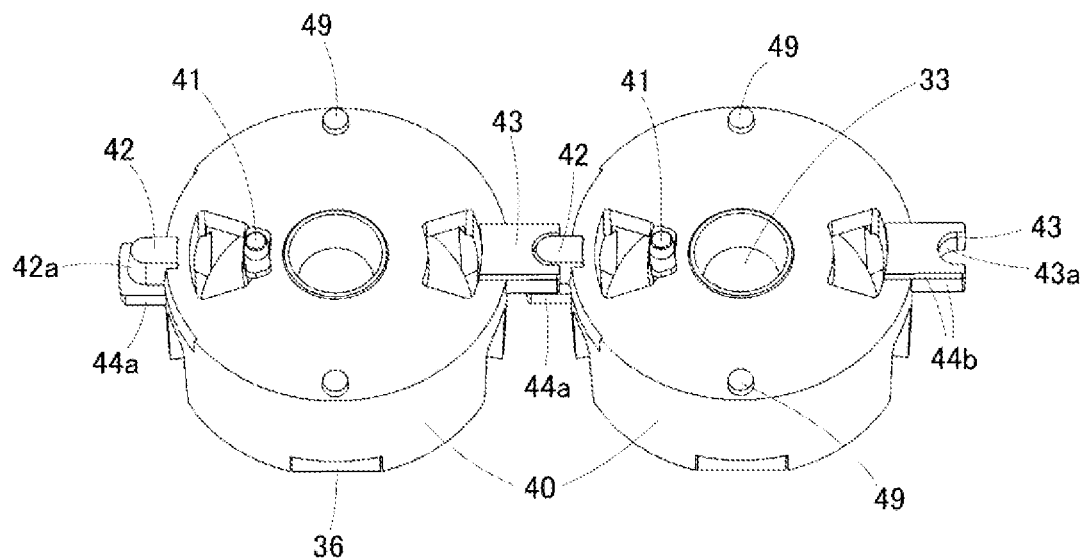
FIG. 7 is a sketch of two housings connected to each other with the lenses positioned and fixed thereto in the exemplary embodiment, viewed from the light entering side with the LED substrate omitted.
Figure 8:
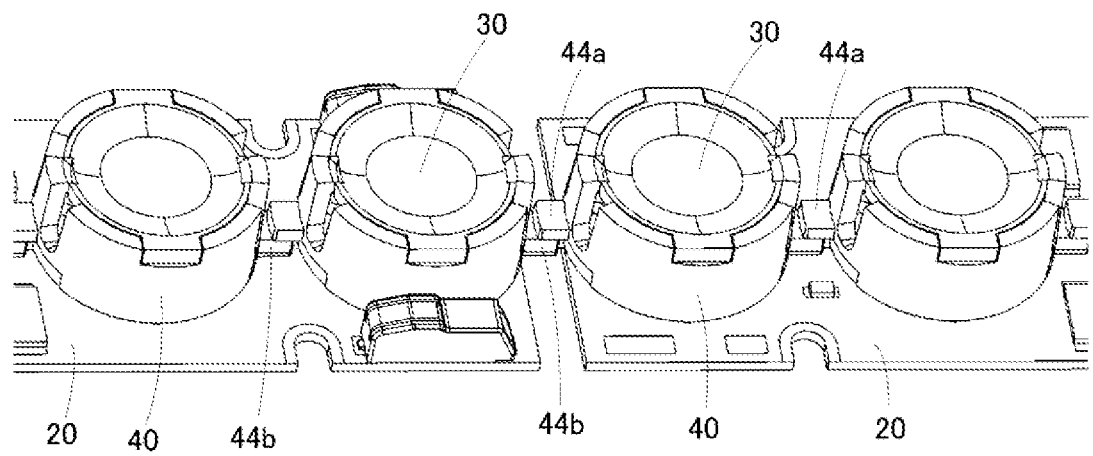
FIG. 8 is a sketch of several housings connected to each other and disposed over two LED substrates with the lenses positioned and fixed thereto in the exemplary embodiment, viewed from the light emitting side.
Figure 9:
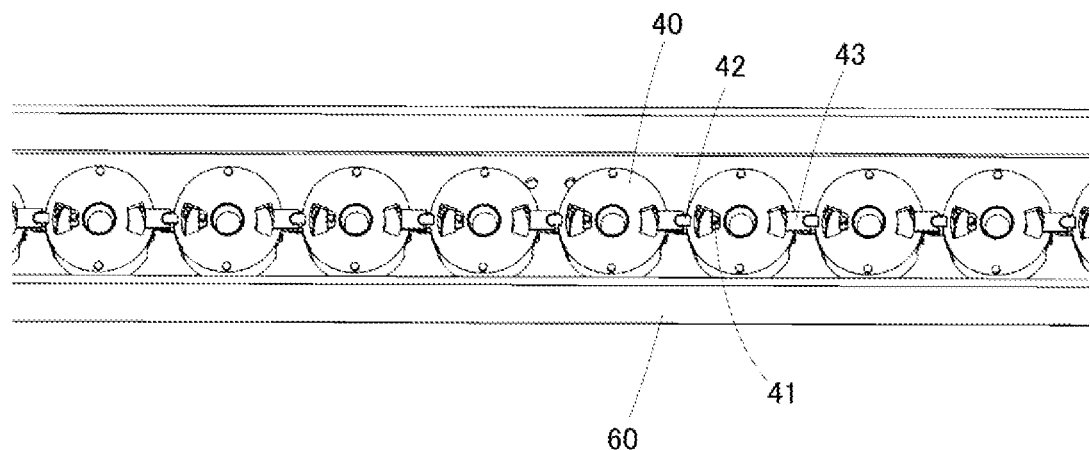
FIG. 9 is a sketch of several housings connected to each other with the lenses positioned and fixed thereto in the exemplary embodiment, viewed from the light entering side with the LED substrate abbreviated.
Figure 10:
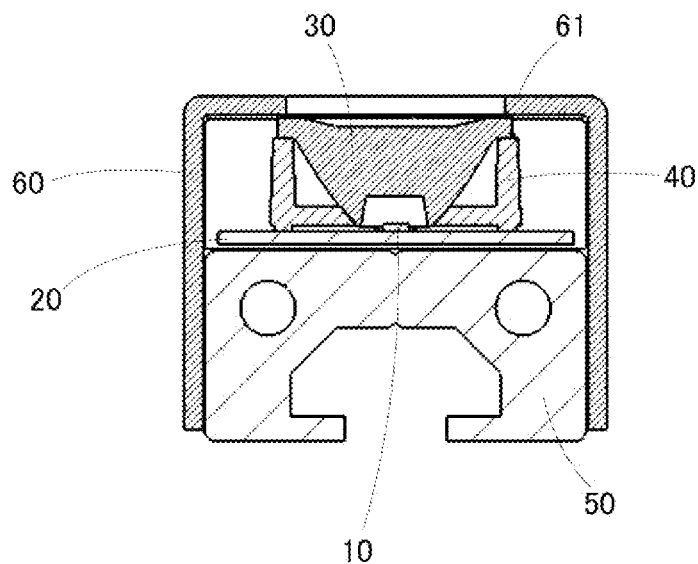
FIG. 10 is a cross-sectional view of the lens mounting structure in the exemplary embodiment, in which the back side of the LED substrate (the face opposite to the LED mounting face) has a heat sink.

FIGS. 6 and 7 are sketches of the two housings 40 connected to each other with the lenses 30 positioned and fixed thereto in the exemplary embodiment, viewed respectively from the light emitting side and the light entering side. The LED substrate 20, a cover 60, and the like are not shown. FIG. 8 is a sketch of the several housings 40 with the lenses 30 positioned and fixed thereto, connected to each other, disposed in one line over the two LED substrates 20, and positioned and fixed to the LED substrates 20 in the exemplary embodiment, viewed from the light emitting side. The cover 60 or the like is not shown. FIG. 9 is a sketch of several housings 40 connected to each other and disposed in one line with the lenses 30 positioned and fixed thereto in the exemplary embodiment, viewed from the light entering side. The LED substrate 20 and a heat sink 50 are not shown. FIG. 10 is a cross-sectional view of the lens mounting structure in the exemplary embodiment, in which the back side of an LED mounting face 23 has the heat sink 50.

Lens

The lens 30 in the embodiment shown in FIGS. 1 and 2, is positioned and fixed to the LED substrate 20 via the housing 40 as shown in FIGS. 4 and 5. Thus, the lens 30 needs no additional structure such as a mounting boss part and a mounting hole which apt to trigger sink marks, air bubbles, and other defects in the molded article at the timing of molding. A lens body 31 of the lens 30 in the embodiment is shaped in a circle in a plan view (when viewed from a light emitting side 34). A surface of the light emitting side 34 is a curved surface with a slightly recessed circumference, and a central part of the surface is a convex curved surface or a recessed curved surface. A recessed part 33 is formed on a light entering side 32 of the lens body 31, thereby allowing light from the LED 10 to enter the lens 30. A side part 35 of the lens body 31 is a tapered part 35 whose diameter increases towards the light emitting side 34 from the light entering side 32. The tapered part 35 may be a linear tapered part whose cross section is shaped with straight lines (whose cross-sectional diameter varies linearly with respect to the distance along the axis direction) or a parabolic tapered part (whose cross section is shaped to fit a parabola with a vertex at the light entering side) or other curved tapered parts.

Both sides of an upper periphery of the lens 30 are each provided with a positioning protrusion 36 to be fitted with a lens positioning recessed part 45 of the housing 40. Both sides of the upper periphery approximately at the center between the both positioning protrusions 36 are each provided with a fixing ditch 37 to be fitted with a lens fixing pawl part 47 of the housing 40. A peripheral part 38 of the light emitting side of the lens 30 can be configured to be covered with a lens holding part 61 of a cover 60 to hold the lens 30.

The lens 30 is not limited to the above description. Depending on the usage of the LED illumination apparatus, lenses with various structures such as a convex lens, a concave lens, a concave-convex lens, a Fresnel lens, and a lens for a searchlight may be employed.

Material of the lens 30 may be inorganic glass, plastic, or other known material. Among these, plastic is preferable from a viewpoint of being excellent in lightness, shock resistance, processability, dyeability, and the like. Non-limiting examples of plastic for the lens 30 include an acrylic resin such as polymethyl methacrylate (PMMA) and the like, a poly carbonate, cellulose acetate butyrate, a urethane resin, and an AS resin.

Housing

An outer shape of the housing 40 is a substantially circular shape when viewed from above. The bottom face of the housing 40 is provided with one projection 41 to be fitted with a positioning hole 21 formed in the LED substrate 20. The projection 41 is preferred to be tightly fitted with the positioning hole 21 by interference fit from viewpoints of positioning and fixing, but may be intermediate-fitted or clearance-fitted from a viewpoint of assembly workability. The projection 41 is normally shaped in a circular columnar shape, but may be shaped in a truncated conical shape with a small taper angle (e.g., 5 degree or less) or in a truncated polygonal pyramid shape. In the projection 41, a base part may be shaped in a circular columnar shape or a polygonal columnar shape whose diameter does not change, and 10 to 90% (preferably 20 to 50%) of the height of the projection from the tip may be shaped in a truncated conical shape or in a truncated polygonal pyramid shape.

A contact area of the bottom face of each of the housings 40 with the LED mounting face 22 of the LED substrate may be reduced to limit a range of affection of the contact pressure by the housing to a wiring pattern in the LED substrate. For example, the area pressured by the contact with the housing may be limited to the bottom faces of connection parts 42 and 43 for connection to the adjoining housing, and the bottom faces of projections 49 (e.g., two to five projections 49) which have small areas and are lower than the height of the projection 41 at the bottom face of the housing 40. In the LED substrate 20, to the area covered with each of the housings 40, the ratio of the area pressured by the direct contact or the contact via a sheet with the housing is 0.5 to 30%, preferably 1 to 10%, and more preferably 2 to 5%.

Each of the housings 40 has, at both sides of its substantially cylindrical periphery, the connection parts 42 and 43 configured to be connected to the adjoining housing 40. The Vertical positions of the connection parts 42 and 43 are preferred to be the bottom end of the housing 40, from a viewpoint of workability of positioning and fixing in the LED substrate.

The connection parts 42 and 43 may be formed in various structures. For example, the connection part 42 may be provided with a protruded part 42*a* having a semicylindrical tip formed at one side of the periphery of the housing 40, while the connection part 43 may be provided with a semicylindrical recessed part 43*a* formed at a tip of a support piece 44*b* protruded outward from the other side of the periphery of the housing 40. On an upper surface of the protruded part 42*a* having the semicylindrical tip, it is preferred to form a support piece 44*a* protruded outward from the periphery of the housing 40, from a viewpoint of holding strength of the protruded part 42*a* having the semicylindrical tip. A semicircle of the semicylindrical recessed part 43*a* is preferred to be slightly over 180 degrees within a range capable of being elastically fitted with the semicylindrical tip. For connecting such connection parts 42 and 43, the semicylindrical tip of the next housing 40 may be pushed from above into the semicylindrical recessed part 43*a* of the housing 40 positioned to the LED substrate in advance. The connection may also be performed by combining lateral movement of the protruded part 42a having the semicylindrical tip towards the semicylindrical recessed part 43a.

As the connection parts 42 and 43 other than those described above, for example, the connection part 42 may be provided with a columnar part (not shown) formed on a lower face of the support piece 44a protruded outward from one side of the periphery of the housing 40, while the connection part 43 may be provided with a columnar hole part (not shown) formed in the support piece 44b protruded outward from the other side of the periphery of the housing 40. The cross-sectional shapes of the columnar part and the columnar hole part are not limited and may be a circle or a polygon such as a square and a hexagon. For connecting such connection parts 42 and 43, the columnar part of the next housing 40 may be pushed from above into the columnar hole part of the housing 40 positioned to the LED substrate in advance, to be fitted therewith.

The connection parts 42 and 43 are preferred to be set to effect connection when the distance between the centers of the adjoining housings 40 meets the prescribed value, from viewpoints of positioning and fixing. From a viewpoint of assembly workability, the adjoining housings 40 are allowed to be slightly moved relatively along a straight line passes through the center lines of the both adjoining housings 40 (i.e., along the direction of a radius of the housing 40). However, the housings 40 are preferred to be set not to deviate from the straight line passes thorough the both center lines.

Both sides of the upper part of the housing 40 are each provided with a lens positioning recessed part 45 to be fitted with the positioning protrusion 36 of the lens 30. The positioning protrusion 36 and the recessed part 45 may be formed in any shape or structure as long as they are capable of being fitted with each other for positioning, and for example, may be a V-shaped protrusion and a V-shaped recessed part. Both sides of the upper part of the housing 40 approximately at the center between the both lens positioning recessed parts 45 are each provided with the lens fixing pawl part 47 which corresponds to the fixing ditch 37 of the lens 30 (sec FIGS. 5 and 6). The lens fixing pawl parts 47 is formed at the tip of the columnar part 46 with arc-shaped cross section which extends upward from the middle of the side face of the housing 40. At the tip of the columnar part 46, a tapered face part 48 which substantially adapts to the tapered part 35 of the lens 30 is formed so as to slightly protrude from the columnar part 46 towards the center of the housing 40. Accordingly, by pressing the lens 30 downward from above the housing 40 (from the light emitting side towards the light entering side), the tapered parts 35 of the lens 30 are brought into contact with the tapered face parts 48 at the tips of the columnar parts 46, and elastically push open the tapered face parts 48. Once the fixing ditches 37 of the lens 30 pass over the tapered face parts 48, the tapered face parts 48 elastically return to their original interval, and the protruded parts of the tapered face parts 48 fit with the fixing ditches 37. In this way, the lens 30 is fixed between the protruded parts of the tapered face parts 48 of the housing 40.

A lens positioning structure and a lens fixing structure in the housing are not limited to the above description, and any structure may be employed as long as positioning and fixing of the lens in the housing can be performed.

Material of the housing 40 may be various kinds of plastic but not limited thereto. Examples of plastic for the housing 40 include polycarbonate, a polyester resin such as PED, and polypropylene.

LED Substrate

A plurality of LEDs 10 are mounted on the LED substrate, and one housing 40 is disposed at each of the LEDs 10. The LED substrate 20 has one positioning hole 21 for each one of the housings 40. The LED to be mounted on the LED substrate is not limited and various LEDs such as a LED which emits natural light, infrared light, or ultraviolet light, and a LED having a phosphor film may be used depending on the usage of the LED illumination apparatus. The LED substrate 20 may have a LED mounting face 22 provided with a light-reflecting layer such as a white inorganic resist layer for efficiently using light emitted from the LEDs 10.

Disposing of Plurality of Housings in LED Substrate

A plurality of the housings 40 with the lenses 30 are positioned and fixed thereto, are disposed on the LED mounting face 22 of the LED substrate 20. At this time, the plurality of the housings 40 may be disposed in one or two or more linear, circular, semicircular or waveform lines. As shown in FIG. 8, the plurality of the housings 40 may be disposed over two or more LED substrates 20.

Cover, Heat Sink

Peripheral parts of the light emitting sides 34 of the lenses 30 and/or the light emitting sides of the housings 40 may be covered with a cover 60 to certainly hold the lenses 30. The cover 60 can partially or completely cover the lenses 30 or the housings 40 excluding the lens bodies 31. The cover 60 may be combined with the LED substrate 20 or with a heat sink 50 integrally formed with the LED substrate. The heat sink 50 may be formed in a known structure. Note that, it is possible to omit the cover 60 if the positioning projection 41 formed at the bottom face of the housing 40 and the positioning hole 21 formed in the LED substrate are tightly fitted with each other by interference fit which allows adjoining housings to strongly connect to each other.

Material of the cover 60 is not limited and may be various kinds. In a structure with the cover 60 covering the surface of the heat sink 50 as shown in FIG. 3, material of the cover 60 is preferred to be high-heat conductive similarly to the heat sink 50. Examples of such high-heat conductive material include high-heat conductive metal such as aluminum and copper, alloy of the metal, high-heat conductive ceramics such as silicon carbide and aluminum nitride, and a high-heat conductive composite material.

Second Embodiment

While the lens 30 in First Embodiment is shaped in a circle in a plan view, the lens 30 may be shaped in an oval in a plan view or a polygon such as a square in a plan view and a hexagon in a plan view. In this case, a shape of the housing 40 in a plan view can be correspondingly changed. While the number of the lenses 30 or the housings 40 and the number of corresponding LEDs 10 are the same, depending on a shape or a structure of the lens 30, the LEDs 10 may be twice, three times or more times as many as the lenses or the housings.

Third Embodiment

In First and Second Embodiments, the necessary number of the positioning holes 21 is the same as the number of the plurality of the housings 40. However, the following lens structure 2 in Third Embodiment can reduce the number of the positioning holes 21 in the LED substrate.

A lens mounting structure includes:

a LED substrate 20 with a plurality of LEDs 10 mounted thereon in three or more lines and having positioning holes 21 aligned in two or more lines (See FIG. 4(A), FIG. 4(B), and FIG. 4(C) and FIG. 5(A), FIG. 5(B), and FIG. 5(C);

a plurality of housings 40 disposed on an LED mounting face 22 of the LED substrate 20 correspondingly to the respective LEDs 10;

lenses 30 positioned and fixed to the housings 40, and a cover 60 for holding peripheral parts of light emitting sides of the lenses 30 and/or light emitting sides of the housings 40, wherein, among the housings 40 mounted in two or more lines, each of the housings in both outermost lines or the housings in odd lines (hereinafter referred to as "K-line housings") has one projection 41 to be fitted with the positioning hole 21 and is connected to the adjoining housing by connection parts 42 and 43, each of the housings excluding the K-line housings (hereinafter referred to as "L-line housings") is connected to the adjoining housing 40 by the connection parts 42 and 43, and articulated to the housing 40 in the adjoining line via an articulation part, but does not have the projection 41 formed thereon, the K-line housings on the LED substrate 20 are positioned through fitting between the positioning holes 21 and the projections 41, and through connection by the connection parts 42 and 43, the L-line housings on the LED substrate 20 are positioned through connection by the connection parts 42 and 43 and through articulation via the articulation parts, and the cover 60 is for holding states of the positioning.

In this lens mounting structure 2, there is no need for providing the positioning hole 21 in the LED substrate in the part where the L-line housings are disposed. Note that, the articulation part may have the same structure as the connection parts 42 and 43.

Fourth Embodiment (First Lens Mounting Method)

First Lens Mounting Method in the present embodiment can be performed according to the following operations (A) to (E).

(A) preparing
(a) a plurality of lenses 30,
(b) a plurality of housings 40 for positioning and fixing the lenses 30, each having a positioning projection 41 formed at the bottom face and having connection parts 42 and 43 for connection to the adjoining housing 40,
(c) an LED substrate 20 having a plurality of housing positioning holes 21 the number of which is the same as the number of the housings 40, and
(d) a cover 60;
(B) positioning and fixing the lens 30 to the housing 40;
(C) connecting the adjoining housings 40 to each other by the connection parts 42 and 43;
(D) fitting the projection 41 of the housing 40 with the positioning hole 21, and
(E) covering peripheral parts 38 of light emitting sides of the lenses 30 and/or light emitting sides of the housings 40 with the cover 60 to hold states of the positioning of the housings 40 in the LED substrate 20 effected by the operations (C) and (D).

In the lens 30 mounting method 1, the operation (B) is preferred to be performed before the operation (C) and (D) from a viewpoint of fixing of the housing 40 in the LED substrate 20, but can be performed after the operations (C) and (D) and before the operation (E). The operations (C) and (D) are preferred to be sequentially performed in each of the housings 40 to be positioned and fixed to the LED substrate 20 from a viewpoint of certainty of positioning and fixing in every housing 40 in the LED substrate 20. However, it is possible to perform the operation (C) in all of or the prescribed number of the housings 40 and thereafter perform the operation (D) in these housings 40. When sequentially performing the operations (C) and (D) in each of the housings 40, it is preferred to start the operations from one side of the LED substrate 20 and proceed towards the other side from a viewpoint of workability, but it is possible to start from the central part of the LED substrate 20 and proceed towards its both ends. Note that, the LED substrate 20, the lens 30, the housing 40, the cover 60 may be the ones described in First Embodiment.

Fifth Embodiment (Second Lens Mounting Method)

The plurality of housings 40 on the LED mounting face 22 of the LED substrate 20 may be disposed in two or more lines, or may be disposed in a curved line such as a circular, semicircular, or waveform line.

While the present invention has been described above with reference to illustrative example embodiments, the present invention is by no means limited thereto. Various changes and variations that may become apparent to those skilled in the art may be made in the configuration and specifics of the present invention without departing from the scope of the present invention.

This application claims priority from Japanese Patent Application No. 2021-172808 filed on Oct. 22, 2021. The entire subject matter of the Japanese Patent Application is incorporated herein by reference.

Industrial Applicability

Some embodiments of the present invention can provide an LED mounting structure for LED illumination which allows relatively easy routing of wiring in the LED substrate, thus is compact, and can reduce costs for production or assembly, a lens mounting method using the lens mounting structure, an LED illumination apparatus including the lens mounting structure, and a LED illumination apparatus production method. The lens mounting structure, the lens mounting method, the LED illumination apparatus, and the LED illumination apparatus production method can be widely used for various LED illumination apparatuses, illumination appliances, and production thereof.

The whole or part of the example embodiments disclosed above can be described as, but not limited to, the following supplementary notes.

Supplementary Note 1

A lens mounting structure for an LED illumination apparatus, including:

an LED substrate with a plurality of LEDs mounted thereon and having a plurality of positioning holes the number of which is the same as the number of a plurality of housings; the plurality of housings disposed on an LED mounting face of the LED substrate correspondingly to the respective LEDs and each having a projection to be fitted with the positioning hole;

lenses positioned and fixed to the housings, and a cover for holding peripheral parts of light emitting sides of the lenses and/or light emitting sides of the housings, wherein the plurality of housings are connected to the adjoining housings by connection parts, each of the housings on the LED substrate is positioned through fitting between the positioning hole and the projection, and through connection by the connection parts, and the cover is for holding states of the positioning.

Supplementary Note 2

The lens mounting structure for an LED illumination apparatus according to Supplementary Note 1, wherein
the connection part of one side of the housing is provided with a protruded part having a semicylindrical tip formed on a periphery of the one side of the housing,
the connection part of the other side is provided with a semicylindrical recessed part formed at a tip of a support piece protruded from a periphery of the other side of the housing, and
the semicylindrical tip of the housing is fitted with the semicylindrical recessed part of the adjoining housing.

Supplementary Note 3

The lens mounting structure for an LED illumination apparatus according to Supplementary Note 1, wherein
the connection part of one side of the housing has a columnar part formed on a lower face of a support piece protruded outward from a periphery of one side of the housing,
the connection part of the other side has a columnar recessed part formed in a support piece protruded outward from a periphery of the other side of the housing, and
the columnar part of the housing is fitted with the columnar recessed part of the adjoining housing.

Supplementary Note 4

The lens mounting structure for an LED illumination apparatus according to any one of Supplementary Notes 1 to 3, wherein
the plurality of housings are disposed on the LED mounting face in two or more lines and connected to each other.

Supplementary Note 5

The lens mounting structure for an LED illumination apparatus according to any one of Supplementary Notes 1 to 4, wherein
the plurality of housings are disposed on the LED mounting face in linear or curved lines.

Supplementary Note 6

The lens mounting structure for an LED illumination apparatus according to any one of Supplementary Notes 1 to 5, wherein the plurality of housings are disposed over two or more LED substrates and connected to each other.

Supplementary Note 7

The lens mounting structure for an LED illumination apparatus according to any one of Supplementary Notes 1 to 6, wherein
to an area covered with the housing in the LED substrate, a ratio of an area pressured by direct contact or contact via a sheet with the housing is 0.5 to 30%.

Supplementary Note 8

A lens mounting structure for an LED illumination apparatus, including:
an LED substrate with a plurality of LEDs mounted thereon in three or more lines and having positioning holes aligned in two or more lines;
a plurality of housings disposed on an LED mounting face of the LED substrate in two or more lines correspondingly to the respective LEDs;
lenses positioned and fixed to the housings, and
a cover for holding peripheral parts of light emitting sides of the lenses and/or light emitting sides of the housings, wherein
among the housings disposed in two or more lines, each of the housings in both outermost lines and the housings in odd lines (hereinafter referred to as "K-line housings") has one projection to be fitted with the positioning hole and is connected to the adjoining housing by the connection parts,
each of the housings excluding the K-line housings (hereinafter referred to as "L-line housings") is connected to the adjoining housing by the connection parts and articulated to the housing in the adjoining line via an articulation part but does not have the projection formed thereon,
the K-line housings on the LED substrate are each positioned through fitting between the positioning hole and the projection, and through connection by the connection parts,
the L-line housings on the LED substrate are each positioned through connection by the connection parts and through articulation by the articulation part, and the cover is for holding states of the positioning.

Supplementary Note 9

The lens mounting structure for an LED illumination apparatus according to Supplementary Note 8, wherein
the articulation part is to be joined with one side or both sides of the housing in lines of either side of the L-line housings.

Supplementary Note 10

A lens mounting structure for an LED illumination apparatus, including
an LED substrate with a plurality of LEDs mounted thereon and having positioning holes the number of which is the same as the number of a plurality of housings;
the plurality of housings disposed on an LED mounting face of the LED substrate correspondingly to the respective LEDs and each having a projection to be fitted with the positioning hole, and lenses positioned and fixed to the housings, wherein
the plurality of housings are connected to the adjoining housings by connection parts, and
each of the housings on the LED substrate is positioned and fixed through fitting between the positioning hole and the projection, and through connection by the connection parts.

Supplementary Note 11

A lens mounting method for an LED illumination apparatus, including:
(A) preparing
(a) a plurality of lenses,
(b) a plurality of housings for positioning and fixing the lenses, each having a positioning projection formed at the bottom face of the housing and having connection parts for connection to the adjoining housing,
(c) an LED substrate with a plurality of LEDs mounted thereon and having positioning holes the number of which is the same as the number of the plurality of housings, and
(d) a cover;
(B) positioning and fixing the lens to the housing;
(C) connecting the adjoining housings to each other by the connection parts;
(D) fitting the projection of the housing with the positioning hole, and
(E) covering peripheral parts of light emitting sides of the lenses and/or light emitting sides of the housings with the cover to hold the states of the positioning of the housings on the LED substrate effected by the operations (C) and (D).

Supplementary Note 12

The method according to Supplementary Note 11, including:
(F) preliminarily disposing the primary housing on the LED substrate by the operation (D);
(G) subjecting the secondary housing to the operations (C) and (D) to position the housing disposed on the LED substrate to the LED substrate, and
(H) repeating the operation (G) as many times as the necessary numbers of the housings.

Supplementary Note 13

The method according to Supplementary Note 11 or 12, wherein the operation (B) is performed
(i) before the operations (C) and (D),
(ii) after the operation (C) and before the operation (D), or
(iii) after the operations (C) and (D) and before the operation (E).

Supplementary Note 14

The method according to any one of Supplementary Notes 11 to 13, wherein all of or the prescribed number of the housings are subjected to the operation (C), and thereafter thus-treated housings are subjected to the operation (D).

Supplementary Note 15

The method according to any one of Supplementary Notes 11 to 14, wherein the plurality of housings are disposed in a liner or curved line.

Supplementary Note 16

The method according to any one of Supplementary Notes 11 to 15, wherein the plurality of housings are disposed in two or more lines.

Supplementary Note 17

A lens mounting method for an LED illumination apparatus, including:
(A) preparing
(a) a plurality of lenses
(b) a plurality of housings for positioning and fixing the lenses, each having a positioning projection formed at the bottom face of the housing and having connection parts for connection to the adjoining housing, and
(c) an LED substrate with a plurality of LEDs mounted thereon and having positioning holes the number of which is the same as the number of the plurality of housings;
(B) positioning and fixing the lens to the housing;
(C) connecting the adjoining housings to each other by the connection parts;
(D) fitting the projection of the housing with the positioning hole, and
(E) positioning and fixing the housing to the LED substrate by the operations (C) and (D).

Supplementary Note 18

An LED illumination apparatus including the lens mounting structure according to any one of Supplementary Notes 1 to 10.

Supplementary Note 19

An LED illumination apparatus production method including the method according to any one of Supplementary Notes 11 to 17.

REFERENCE SIGNS LIST

10: LED
20: LED substrate
21: positioning hole
22: LED mounting face
23: back side of LED mounting face
30: lens
31: lens body
32: light entering side
33: recessed part at light entering side (recessed part)
34: light emitting side
35: side part (tapered part)
36: positioning protrusion
37: fixing ditch
38: peripheral part of light emitting side
40: housing
41: positioning projection (projection)

42: connection part at one side (connection part)
42a: protruded part having semicylindrical tip
43: connection part at other side (connection part)
43a: semicylindrical recessed part
44a: support piece
44b: support piece
45: lens positioning recessed part
46: columnar part
47: lens fixing pawl part
48: tapered face part
50: heat sink
60: cover
61: lens holding part

The invention claimed is:

1. An LED illumination apparatus comprising:
an LED substrate having a plurality of positioning holes, and an LED mounting face;
a plurality of LEDs mounted on the LED mounting face;
a plurality of housings disposed on the LED mounting face of the LED substrate correspondingly to the respective LEDs, each housing having a projection configured to be fitted in a corresponding one of the positioning holes, each housing further having a connecting part;
a plurality of lenses, each lens positioned and fixed to a corresponding one of the housings; and
a cover disposed over the LED mounting face, and configured to contact peripheral parts of a light emitting side of the lenses and of the housing, to hold them in position relative to the LED substrate,
wherein the plurality of housings are connected to adjoining housings by the connection parts fitting between the positioning hole and the projection.

2. The LED illumination apparatus according to claim 1, each one of the plurality of housings further comprising:
a first connection part disposed on one side of the housing, and provided with a protruded part having a semicylindrical tip formed on a peripheral surface of the one side of the housing;
a second connection part disposed on another side of the housing, and including a support piece protruded from a peripheral surface of the other side of the housing, and provided with a semicylindrical recessed part formed at a tip of the support piece,
wherein the semicylindrical tip of one of the housings is fitted with the semicylindrical recessed part of an adjoining housing.

3. The LED illumination apparatus according to claim 1, each one of the plurality of housings further comprising:
a first connection part disposed on one side of the housing, and having a first support piece protruded from a peripheral surface of the one side of the housing, the support piece including a columnar part formed on a lower face thereof, and
a second connection part disposed on another side of the housing, having a second support piece protruded outward from a peripheral surface of the other side of the housing, the second support piece including columnar hole formed thereon,
wherein the columnar part of one of the housings is fitted with the columnar hole of an adjoining housing.

4. The LED illumination apparatus according to claim 1, wherein the plurality of housings are arranged in at least two lines, and connected to each other.

5. The LED illumination apparatus according to claim 1, wherein the plurality of housings are arranged in straight or curved lines, and connected to each other.

6. The LED illumination apparatus according to claim 1, wherein the plurality of housings are disposed over at least two LED substrate, and connected to each other.

7. The LED illumination apparatus according to claim 1, wherein total area of the LED substrate in proximate contact with the plurality of housings he plurality of housings is 0.5 to 30% of a total area projected by the plurality of housings in a direction normal to the LED substrate.

8. The LED illumination apparatus according to claim 1, wherein the number of the plurality of openings matches the number of the plurality of housings.

9. An LED illumination apparatus, comprising:
an LED substrate having a plurality of positioning holes arranged in at least two lines, and an LED mounting face;
a plurality of LEDs mounted on the LED mounting face;
a plurality of housings disposed on the LED mounting face of the LED substrate in at least two lines correspondingly to the respective LEDs, the plurality of housings including connecting parts;
a plurality of lenses, each lens positioned and fixed to a corresponding one of the housings; and
a cover disposed over the LED mounting face, and configured to contact at least one of peripheral parts of light emitting sides of the lenses and
light emitting sides of the housings, to hold them in position relative to the LED substrate,
wherein each of the housings in both outermost lines, or the housings in odd lines (hereinafter referred to "K-line housings"), further include one projection configured to be fitted with the positioning hole, and connected to the adjoining housing by the connection parts,
each of the housings excluding the K-line housings (hereinafter referred to as "L-line housings") is connected to an adjoining housing by the connection parts, and include an articulation part providing an articulated connection to a housing in an adjoining line,
the K-line housings are each positioned on the LED substrate by fitting between the positioning hole and the projection, and connection by the connection parts,
the L-line housings are each positioned on the LED substrate by connection by the connection parts and the articulation part.

10. The LED illumination apparatus according to claim 9, wherein the articulation part is configured to be joined with one side or both sides of the housing in lines or either side of the L-line housings.

11. A lens mounting method for an LED illumination apparatus, comprising:
(A) preparing:
(i) a plurality of lenses,
(ii) a plurality of housings for positioning and fixing the lenses, each having a projection at a bottom face for positioning, and having connection parts for connection to the adjoining housing,
(iii) an LED substrate with a plurality of positioning holes matching a number of the housings, and a plurality of LEDs mounted on the LED substrate, and
(iv) a cover;
(B) positioning and fixing each lens to the corresponding housing;
(C) connecting the adjoining housings to each other by the connection parts;
(D) fitting the projection of the housing with the positioning hole, and (E) covering at least one peripheral parts of light emitting sides of the lenses and light emitting sides of the housings with the cover to hold the housings in position relative to the LED substrate, as effected by the operations (C) and (D).

12. The method according to claim 11, further comprising:
   (F) preliminarily disposing a primary housing on the LED substrate by the operation (D);
   (G) subjecting a secondary housing to the operations (C) and (D) to position the secondary housing disposed on the LED substrate to the LED substrate; and
   (H) repeating the operation (G) for a remaining number of the plurality of housings.

13. The method according to claim 11, wherein the operation (B) is performed:
   (i) before the operations (C) and (D),
   (ii) after the operation (C) and before the operation (D), or
   (iii) after the operation (C) and (D), and before the operation (E).

14. The method according to claim 11, wherein the plurality of housings are disposed in straight or curved line.

15. The method according to claim 11, wherein the plurality of housings are disposed in at least two lines.

* * * * *